United States Patent
Wang et al.

(10) Patent No.: US 10,854,591 B2
(45) Date of Patent: Dec. 1, 2020

(54) SEMICONDUCTOR DEVICE INCLUDING A REPEATER/BUFFER AT UPPER METAL ROUTING LAYERS AND METHODS OF MANUFACTURING THE SAME

(71) Applicant: Samsung Electronics Co., Ltd., Suwon-si (KR)

(72) Inventors: Wei-E Wang, Austin, TX (US); Titash Rakshit, Austin, TX (US); Borna J. Obradovic, Leander, TX (US); Chris Bowen, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 173 days.

(21) Appl. No.: 15/442,592

(22) Filed: Feb. 24, 2017

(65) Prior Publication Data
US 2018/0130785 A1 May 10, 2018

Related U.S. Application Data

(60) Provisional application No. 62/417,971, filed on Nov. 4, 2016.

(51) Int. Cl.
*H01L 27/12* (2006.01)
*H01L 21/66* (2006.01)
(Continued)

(52) U.S. Cl.
CPC .... *H01L 27/0207* (2013.01); *H01L 21/02068* (2013.01); *H01L 21/02164* (2013.01);
(Continued)

(58) Field of Classification Search
CPC ......... H01L 2224/73265; H01L 27/088; H01L 2924/13091; H01L 23/481; H01L 21/76895; H01L 21/823475; H01L 23/48; H01L 21/76254; H01L 21/823431; H01L 21/84; H01L 21/845; H01L 27/0688; H01L 27/0886; H01L 29/0673; H01L 29/66439;
(Continued)

(56) References Cited

U.S. PATENT DOCUMENTS

| 7,094,651 B2 | 8/2006 | Mitzi et al. |
| 7,494,841 B2 | 2/2009 | Mitzi et al. |

(Continued)

OTHER PUBLICATIONS

Kaustav Banerjee et al., 3-D ICs: A Novel Chip Design for Improving Deep-Submicrometer Interconnect Performance and Systems-on-Chip Integration, Proceedings of the IEEE, May 2001, pp. 602-633, vol. 8, No. 5, IEEE.

(Continued)

*Primary Examiner* — Jarrett J Stark
(74) *Attorney, Agent, or Firm* — Lewis Roca Rothgerber Christie LLP

(57) ABSTRACT

A semiconductor device includes a series of metal routing layers and a complementary pair of planar field-effect transistors (FETs) on an upper metal routing layer of the metal routing layers. The upper metal routing layer is M3 or higher. Each of the FETs includes a channel region of a crystalline material. The crystalline material may include polycrystalline silicon. The upper metal routing layer M3 or higher may include cobalt.

10 Claims, 10 Drawing Sheets

(51) Int. Cl.

| | | |
|---|---|---|
| H01L 23/522 | (2006.01) | |
| H01L 27/02 | (2006.01) | |
| H01L 21/8238 | (2006.01) | |
| H01L 21/822 | (2006.01) | |
| H01L 21/02 | (2006.01) | |
| H01L 21/28 | (2006.01) | |
| H01L 21/311 | (2006.01) | |
| H01L 21/768 | (2006.01) | |
| H01L 21/84 | (2006.01) | |
| H01L 23/528 | (2006.01) | |
| H01L 23/532 | (2006.01) | |
| H01L 27/06 | (2006.01) | |
| H01L 27/092 | (2006.01) | |
| H01L 29/04 | (2006.01) | |
| H01L 29/16 | (2006.01) | |
| H01L 29/47 | (2006.01) | |
| H01L 29/66 | (2006.01) | |

(52) U.S. Cl.
CPC .. *H01L 21/02175* (2013.01); *H01L 21/02236* (2013.01); *H01L 21/02244* (2013.01); *H01L 21/02532* (2013.01); *H01L 21/02595* (2013.01); *H01L 21/28088* (2013.01); *H01L 21/31111* (2013.01); *H01L 21/76802* (2013.01); *H01L 21/76877* (2013.01); *H01L 21/8221* (2013.01); *H01L 21/823807* (2013.01); *H01L 21/823828* (2013.01); *H01L 21/823842* (2013.01); *H01L 21/823871* (2013.01); *H01L 21/84* (2013.01); *H01L 23/528* (2013.01); *H01L 23/5226* (2013.01); *H01L 23/53209* (2013.01); *H01L 23/53228* (2013.01); *H01L 23/53242* (2013.01); *H01L 23/53257* (2013.01); *H01L 27/0688* (2013.01); *H01L 27/092* (2013.01); *H01L 27/1203* (2013.01); *H01L 27/124* (2013.01); *H01L 27/127* (2013.01); *H01L 27/1259* (2013.01); *H01L 29/04* (2013.01); *H01L 29/16* (2013.01); *H01L 29/47* (2013.01); *H01L 29/665* (2013.01)

(58) Field of Classification Search
CPC .............. H01L 29/775; H01L 21/76846; H01L 21/76843; H01L 23/5226; H01L 23/53295; H01L 2924/01027; H01L 2924/01044; B82Y 10/00
See application file for complete search history.

(56) References Cited

U.S. PATENT DOCUMENTS

| | | | |
|---|---|---|---|
| 8,039,926 B2 | 10/2011 | Song et al. | |
| 8,916,914 B2 | 12/2014 | Kim et al. | |
| 9,080,969 B2 | 7/2015 | Liu et al. | |
| 9,130,077 B2 | 9/2015 | Weng et al. | |
| 9,153,620 B2 | 10/2015 | Wang et al. | |
| 9,389,199 B2 | 7/2016 | Cheng et al. | |
| 9,419,048 B2 | 8/2016 | Chou et al. | |
| 9,459,234 B2 | 10/2016 | Kalnitsky et al. | |
| 9,466,729 B1 | 10/2016 | Fanelli | |
| 10,276,794 B1* | 4/2019 | Peng | H01L 43/12 |
| 2003/0141504 A1* | 7/2003 | Kuwabara | H01L 27/1214 257/66 |
| 2004/0266045 A1 | 12/2004 | Mears et al. | |
| 2005/0023656 A1* | 2/2005 | Leedy | H01L 29/42328 257/678 |
| 2006/0181308 A1* | 8/2006 | Madurawe | H01L 27/0207 326/41 |
| 2006/0205124 A1 | 9/2006 | Herner | |
| 2012/0068179 A1* | 3/2012 | Ishida | H01L 27/0688 257/57 |
| 2012/0175624 A1* | 7/2012 | Erickson | H01L 29/7827 257/66 |
| 2014/0117421 A1 | 5/2014 | Seo et al. | |
| 2014/0131698 A1 | 5/2014 | Kim et al. | |
| 2014/0145272 A1* | 5/2014 | Or-Bach | H01L 27/0688 257/369 |
| 2014/0197459 A1 | 7/2014 | Kis et al. | |
| 2014/0264468 A1 | 9/2014 | Cheng et al. | |
| 2015/0200308 A1 | 7/2015 | Karda et al. | |
| 2017/0098661 A1* | 4/2017 | Rakshit | H01L 29/66969 |
| 2017/0098662 A1* | 4/2017 | Sunamura | H01L 23/5226 |
| 2018/0130785 A1* | 5/2018 | Wang | H01L 21/02068 |

OTHER PUBLICATIONS

L. Brunet et al., First demonstration of a CMOS over CMOS 3D VLSI CoolCube™ integration on 300mm wafers, Symposium on VLSI Technology Digest of Technical Papers, 2016, 2 pages, IEEE.

E. Fortunato et al., Oxide Semiconductor Thin-Film Transistors: A Review of Recent Advances, Advanced Materials, 2012, pp. 2945-2986, 24, Wiley-VCH Verlag GmbH & Co., KGaA, Weinheim.

K. Graff et al., Metal Impurities in Silicon-Device Fabrication, Springer Series in Materials Science, Second, Revised Edition, 2000, 286 Pages, vol. 24, Springer-Verlag Berlin Heidelberg, New York.

Gordon Grzybowski et al., Ulra-Low-Temperature Epitaxy of Ge-based Semiconductors and Optoelectronic Structures on Si(100): Introducing Higher Order Germanes ($Ge_3H_8$, $Ge_4H_{10}$), Chemistry of Materials, Apr. 5, 2012, pp. 1619-1628, 24, American Chemical Society.

Ted Kamins, Polycrystalline Silicon for Integrated Circuits and Displays, Second Edition, 1998, 391 pages, Springer Science+Business Media, LLC, New York.

Ed Korczynski, Leti's CoolCube 3D Transistor Stacking Improves with Qualcomm Help, Apr. 27, 2016, 5 pages, Semiconductor Manufacturing & Design Community. (Weblink: https://web.archive.org/web/20160502042644/http://semimd.com/blog/2016/04/27/letis-coolcube-3d-transistor-stacking-improves-with-qualcomm-help/).

K.F. Lee et al., Thin film Mosfet's fabricated in laser-annealed polycrystalline silicon, Applied Physical Letters, Jul. 15, 1979, pp. 173-175, 35(2), American Institute of Physics.

M.Y. Lee et al., Bulk versus Surface Transport of Nickel and Cobalt on Silicon, Physical Review Letters, Dec. 11, 1995, pp. 4460-4463, vol. 75, No. 24, the American Physical Society.

Yao-Jen Lee et al., Low-Temperature Microwave Annealing Processes for Future IC Fabrication—A Review, IEEE Transactions on Electron Devices, Mar. 2014, pp. 651-665, vol. 61, No. 3, IEEE.

F.E. Leys et al., Thin epitaxial Si films as a passivation method for Ge(100): Influence of deposition temperature on Ge surface segregation and the high-k/Ge interface quality, Materials Science in Semiconductor Processing 9, Sep. 15, 2006, pp. 679-684, Elsevier Ltd.

Tatsuya Onuki et al., Embedded Memory and Arm Cortex-M0 Core Using 60-nm C-Axis Aligned Crystalline Indium-Gallium-Zinc Oxide FET Integrated with 65-nm Si CMOS, Symposium on VLSI Circuits Digest of Technical Papers, 2016, 2 Pages, IEEE.

T. Sameshima et al., XeC1 Excimer Laser Annealing Used in the Fabrication of Poly-Si TFT's, IEEE Electron Device Letters, May 1986, pp. 276-278, vol. 7, No. 5, IEEE.

Akira Wada et al., Low activation energy, high-quality oxidation of Si and Ge using neutral beam, Applied Physics Letters, May 19, 2011, pp. 203111-1 to 203111-3, 98(20), American Institute of Physics.

Jun-Fei Zheng et al., Selective Co Growth on Cu for Void-Free Via Fill, 2015, pp. 265-268, IEEE.

Tosun, et al.; High-Gain Inverters Based on $WSe_2$ Complementary Field-Effect Transistors; Acsnano, vol. 8, No. 5, 4948-4953, 2014, pp. 4948-4953.

Das, et al.; Electrostatically Doped $WSe_2$ CMOS Inverter; Center for Nanoscale Materials,© 2014 IEEE, pp. 185-186.

(56) References Cited

OTHER PUBLICATIONS

Tao, et al.; The energy-band alignment at molydbenum disulphide and high-k dielectrics interfaces; Applied Physics Letters 104; © 2014 AIP Publishing LLC, 4 sheets.

Mejia, et al.; Low-Temperature Hybrid CMOS Circuits Based on Chalcogenides and Organic TFTs; IEEE Electron Device Letters, vol. 32, No. 8, Aug. 2011, pp. 1086-1088.

Ye, Device Perspective of 2D Materials Beyond Graphene; Proceedings of the 14th IEEE International Conference on Nanotechnology, Aug. 18-21, 2014, pp. 896-897.

\* cited by examiner

SEMICONDUCTOR DEVICE INCLUDING A REPEATER/BUFFER AT UPPER METAL ROUTING LAYERS AND METHODS OF MANUFACTURING THE SAME

CROSS-REFERENCE TO RELATED APPLICATION(S)

This utility patent application claims priority to and the benefit of U.S. Provisional Patent Application Ser. No. 62/417,971, filed on Nov. 4, 2016, entitled "Low temperature grown poly-silicon based CMOS including Repeaters/Buffers inserted at higher metal layers," the entire content of which is incorporated herein by reference.

FIELD

One or more aspects of example embodiments of the present disclosure relate to semiconductor devices including transistors at upper metal routing layers.

BACKGROUND

Overall chip performance may be severely limited by interconnect performance of the back-end-of-line (BEOL) for chips at scaled nodes, e.g., the 7 nm node and beyond. This is due to the fact that line and via resistances increase significantly with the reduction of feature sizes. As feature sizes are scaled, metal pitches and transistors are also scaled. The reduction in metal pitch (i.e., reducing the distance between the metal lines), can result in an increase in capacitance per unit length. Furthermore, a reduction in the cross-sectional area of the interconnect, associated also with a reduction in metal pitches, can result in a non-linear increase in the resistivity of the interconnect, thus increasing (e.g., degrading) the interconnect via and line resistances and further worsening (e.g., degrading) overall chip performance. In short, simple geometrical scaling of devices can indeed improve transistor performance at the front-end-of-line (FEOL). However, this improvement cannot be translated through BEOL easily due to the corresponding much higher capacitance-resistance (RC) delay resulting from the scaled metal pitches.

To improve the interconnect performance of BEOL, repeaters may be inserted to boost the signal level for long routing wires, e.g., wires higher than in metal 2 (M2) layer (e.g., M3 or M4, etc.) to increase or maximize the corresponding circuit performance. Currently, copper (Cu) is commonly utilized for the metal layers and may cause contamination to the repeaters. Further, repeaters may also be degraded due to failed CMOS functions that are utilized to connect repeaters to higher metal routing layers.

The above information disclosed in this Background section is provided for enhancement of understanding of the background of the invention, and therefore, it may contain information that does not constitute prior art.

SUMMARY

The present disclosure is directed to various embodiments of a semiconductor device. In one embodiment, the semiconductor device includes metal routing layers M1 to Ma (a being an integer selected from 4 or greater); and a complementary pair of planar field-effect transistors (FETs) on metal routing layer Mb (b being smaller than a and selected from 3 or greater), wherein each of the FETs comprises a channel region formed of a polycrystalline material.

The polycrystalline material may include polycrystalline silicon.

b may be 3, and M3 may include cobalt (Co) or ruthenium (Ru).

M1, M2 and M3 may each include cobalt (Co) or ruthenium (Ru).

The semiconductor device may further include an insulating material on metal routing layer Mb, and the complementary pair of planar FETs are on the insulating layer.

The crystalline material may have a bandgap of about 1 eV or greater and a mobility of about 100 $cm^2$/V-sec or greater.

The semiconductor device may or may not include a shallow trench isolation (STI) between the pair of planar FETs to isolate them from each other.

Each FET of the pair of planar FETs may further include source and drain regions comprising the crystalline or polycrystalline material of the channel region.

Each FET may further include a pair of metal regions directly contacting the source and drain regions with regular salicide formation between the pair of metal regions and the source and drain regions.

The metal regions may include Ti, Ni, Pt and/or Co.

The complementary pair of planar FETs may be in an inverter configuration.

The FETs may be arranged in a repeater/buffer circuit consisting of one level of via or no vias.

Each FET may include a gate stack comprising non-crystalline materials.

The crystalline material layer may be about 5 nm to about 15 nm thick.

A method of manufacturing a semiconductor device includes: depositing a first interlayer dielectric on metal routing layer Mb, b being an integer selected from 3 or greater, wherein the metal routing layer Mb is formed on a wafer and comprises Co; conducting decontamination of Co; depositing a polycrystalline silicon layer at a temperature of 400° C. or lower on the first interlayer dielectric; depositing an HK dielectric layer at temperatures lower than 400° C.; and depositing corresponding NMOS and PMOS work function materials on the HK dielectric layer.

The conducting of decontaminating of Co may include removing potential Co atoms on front, back and bevel sides of the wafer utilizing wet cleaning; conducting oxidation process to form cobalt oxides; and depositing a dielectric layer having a thickness of 10 nm or more on the wafer.

The method may further include depositing metallic Schottky source/drain contacts at a temperature of 400° C. or lower.

The depositing of the HK dielectric layer at temperatures lower than 400° C. may include forming silicon oxides utilizing a low temperature oxidation assisted by neutral oxygen beam.

The method may further include depositing a second interlayer dielectric on the NMOS work function material and the PMOS work function material; etching via holes through the second interlayer dielectric; depositing metal into the etched via holes to form vias; and depositing an upper metal routing layer Mb+1. The metal routing layer Mb+1 may include copper or tungsten.

This summary is provided to introduce a selection of features and concepts of embodiments of the present disclosure that are further described below in the detailed description. This summary is not intended to identify key or essential features of the claimed subject matter, nor is it intended to be utilized in limiting the scope of the claimed

DETAILED DESCRIPTION

Figure 1:
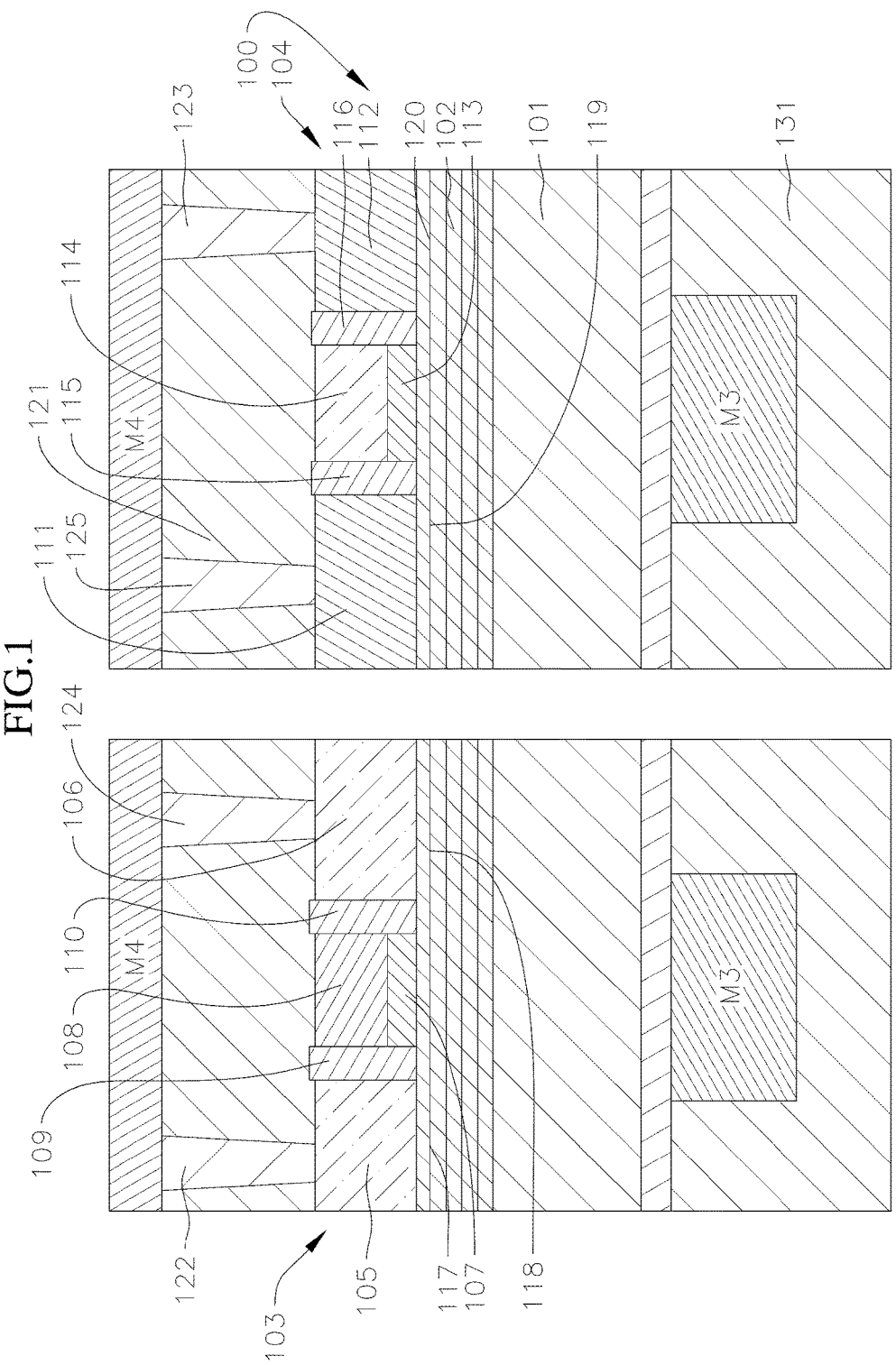
FIG. 1 is a schematic cross-sectional view of a semiconductor device including a repeater inserted on an upper metal routing layer according to one or more example embodiments of the present disclosure.

The present disclosure is directed to various embodiments of a semiconductor device including one or more transistors on or between the upper metal routing layers of the semiconductor device. The one or more transistors may be combined with other transistors to form a circuit, such as a repeater/buffer circuit. The one or more transistors may include a crystalline material selected from a polycrystalline material grown at a low temperature. Additionally, the semiconductor device according to one or more embodiments of the present disclosure may include reduced or limited vias in the repeater/buffer circuit compared to a repeater/buffer circuit formed below the metal routing layers of the semiconductor device. Placing the repeater/buffer circuit in or between the routing layers at M3 or above recovers the loss of performance from middle of line (MOL) capacitances. Positioning the repeater/buffer circuit in or between the upper metal routing layers improves the net routing delay, even if the repeater/buffer circuit is not as high performance as a circuit formed by use of the transistors in the front-end-of-line (FEOL).

Additionally, positioning the repeater/buffer circuit in or between the upper metal routing layers will reduce the number of repeaters and associated interconnect length. Thus opens up area to insert other functionalities on-chip.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use,"

"using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic cross-sectional view of a repeater 100 inserted at an upper metal routing layer (e.g., M3 or above) of a semiconductor device according to one or more example embodiments of the present disclosure. In the illustrated embodiment, the repeater 100 is inserted between metal routing layer M3 and metal routing layer M4. However, embodiments of the present disclosure are not limited thereto. In one or more embodiments, the repeater 100 may be inserted between any other suitable upper metal routing layers, such as, for instance, between metal routing layer M2 and M3, or between M4 and M5. As described above, repeaters may be inserted more frequently at the 7 nm node and beyond to boost the signal level for long routing wires due to non-linear increase in resistances. However, repeaters may be degraded due to high via resistances and may consume significant area. Inserting the repeater 100 at the upper metal routing layers, as in one or more example embodiments according to the present disclosure, is configured to also reduce or minimize the effect of high via resistances.

Metal routing layer (e.g., M3) on which the repeater is formed may be formed of a non-Cu metal, for example, cobalt (Co). According to one or more embodiments, each of the preceding metal routing layers up to the layer on which the repeater is formed may be formed of a non-Cu metal, for example, Co. For example, each of M1, M2 and M3 may be formed of Co.

When Cu is utilized for the metal routing layers, Cu is to be electroplated into a well encapsulated structure (e.g., dual damascene with certain diffusion barrier layer to avoid Cu diffusion). During the electroplating process, the backside and bevel of silicon wafers are also to be contaminated with Cu from electro-plating bath and from the mechanical interactions with those Cu contaminated tools. In addition, Cu has high surface/bulk diffusivity on/in many materials. Therefore, when the repeaters are formed over the Cu routing layers, Cu contamination is likely to happen. In fact, Cu contamination has been considered as one of the risks for any high-volume manufacturing (HVM) fabrication. Cu can not only fatally degrade transistors if contaminated but also easily cross-contaminate other toolsets to plague the complete manufacturing lines if not taken care of.

Co may be utilized to replace Cu at the appropriate metal layers due to its comparably low electrical resistance. In addition, when Cu is utilized for the metal routing layers, a liner (barrier, such as TiN or TaN) is required to reduce the contamination of Cu to other layers. On the other hand, interconnects utilizing non-Cu metals such as Co do not necessarily require a liner. In one embodiment, Co is utilized to replace Cu for forming one or more of the metal layers and a liner is utilized to separate the Co from the ILD. In another embodiment, Co is utilized to replace Cu for forming one or more of the metal layers with a thinner liner than required when Cu is utilized, or without a liner to separate Co from the ILD, to further lower the electrical resistance of the metal layer(s) at very scaled nodes for the extreme dimensions.

Further, when non-Cu metal, for example, Co, is utilized to form the metal routing layers, Cu contamination on the repeaters may be reduced or avoided. However, as a transition metal with certain diffusivity in silicon, Co may diffuse into the high-K (HK) dielectric material in the gate stack of the FETs. Therefore, a three-step decontamination process, to be described in more detail later on, may be applied to reduce or avoid any potential Co contamination on the repeaters.

As can be seen in FIG. 1, according to one or more example embodiments of the present disclosure, the repeater 100 includes a first inter-layer dielectric (ILD) layer (i.e., a first ILD layer) 101 on the metal routing layer M3 and the insulation layer 131 in which metal routing layer M3 is embedded. In one or more embodiments, the first ILD layer 101 may be made of any suitable material, for example, a material having a suitably small dielectric constant, such as, for instance, fluorine-doped silicon dioxide or carbon-doped silicon dioxide.

As can be seen in FIG. 1, according to one or more example embodiments of the present disclosure, the repeater 100 also includes a crystalline material layer 102 formed on the first ILD layer 101. The crystalline material layer 102 according to one or more example embodiments is made of a polycrystalline material. In one or more embodiments, the crystalline material layer 102 is made of polycrystalline silicon (also referred to as polysilicon or poly-Si) sequentially formed on the top of the complementary metal-oxide-semiconductor (CMOS) at the FEOL on the same wafer utilizing a low temperature deposition process. The polycrystalline silicon layer may be 5 nm to 15 nm thick.

Figure 2:
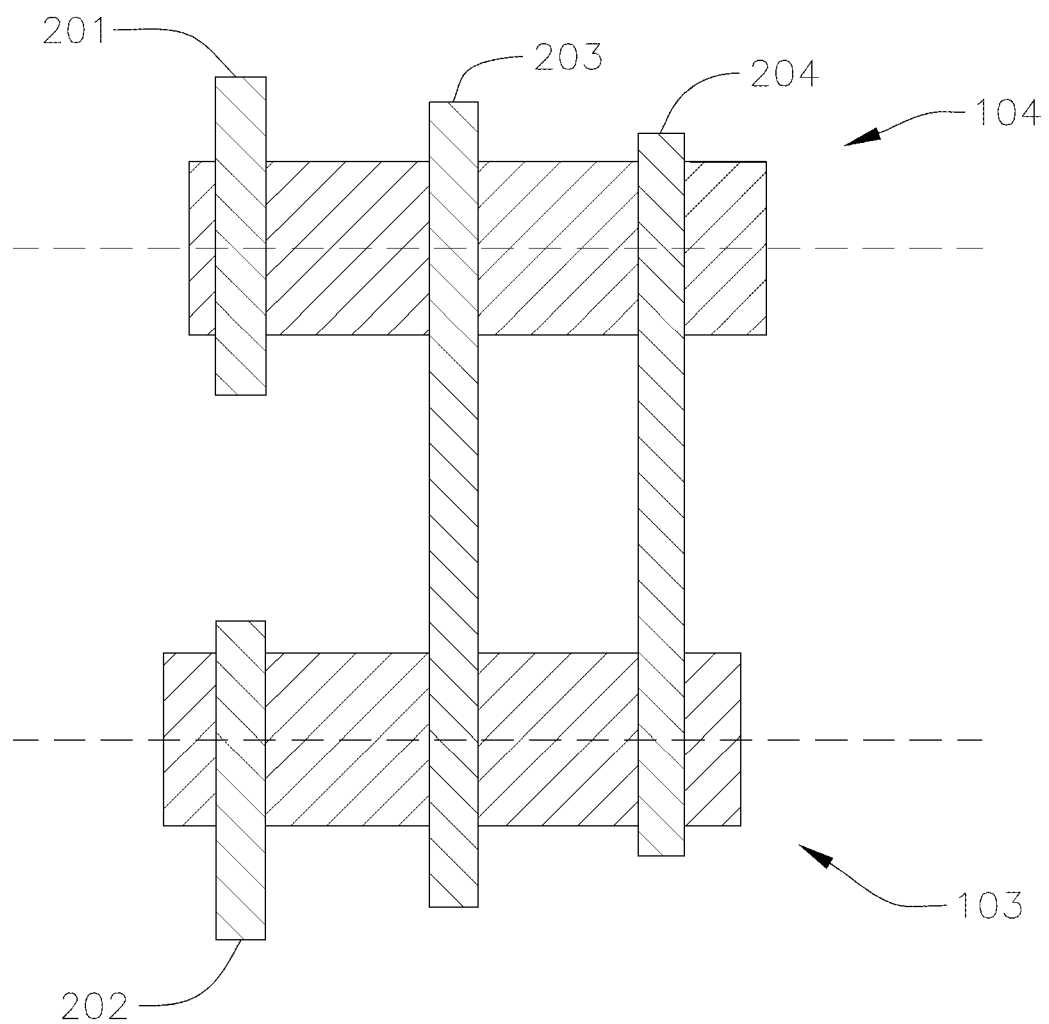
FIG. 2 is a schematic cross-sectional view of a pair of NMOS and PMOS transistors in an inverter configuration to function as a repeater.

As can be seen in FIG. 1, according to one or more embodiments of the present disclosure, the repeater 100 also includes a complementary pair of planar FETs 103, 104 (e.g., an NMOS transistor and a PMOS transistor, respectively) formed utilizing the crystalline material layer 102. Each of the planar FETs 103, 104 has a channel region made of portions of the crystalline material layer 102. Utilizing the crystalline material layer 102 as an active layer (e.g., a channel layer), according to one or more example embodiments, the NMOS transistor 103 and the PMOS transistor 104 are respectively formed in a CMOS configuration. Also, the complementary pair of planar FETs 103, 104 may be formed in an inverter configuration to function as a repeater, as illustrated in FIG. 2. When the FETs 103, 104 are in an inverter configuration configured to function as a repeater, a power line 201 is connected to the PMOS transistor 104, a grounding line 202 is connected to the NMOS transistor 103, and gate and drain lines 203, 204, respectively, couple the NMOS and PMOS transistors 103, 104.

The NMOS transistor 103 includes, in addition to a corresponding portion of the crystalline material layer 102, source/drain (S/D) electrodes 117 and 118, a gate insulation layer 107 on the crystalline material layer 102, a gate electrode 108 on the gate insulation layer 107, and spacers 109 and 110 isolating the gate electrode 108 from the low temperature contacts 105 and 106. The spacers 109 and 110 may be made, for example, of nitride. The S/D electrodes 117, 118 may be made of, for example, the same crystalline material as the channel region. In one embodiment, the S/D electrodes may be formed through a selective epitaxial (EPI) regrowth process utilizing higher order precursors instead of silane or germane for reducing the sheet resistance and boosting device performance. Suitable precursors for the EPI regrowth process may include $Si_2H_6$, $Si_3H_8$, $Si_4H_{10}$, $Ge_2H_6$, $Ge_4H_{10}$, etc., deposited at temperatures below 400° C. Further, the gate electrode 108 according to one or more example embodiments may be made of polycrystalline semiconductor such as, for example, polycrystalline Si, Ge and/or InGaAs, and may be doped N-type. The low temperature contact 105 and 106, also referred to as the metal region, may be in direct contact with the source/drain electrodes 117 and 118 (also referred to as the source/drain regions), with regular salicide formation between the low temperature contact and the source/drain regions. The low temperature contact 105 and 106 may be formed of a metal chosen to reduce or minimize the barrier to the source/drain regions. Suitable metals include Ti, Ni, Pt, and/or Co, or any other suitable metal or metals known to those skilled in the art.

The PMOS transistor 104 includes, in addition to a corresponding portion of the crystalline material layer 102, source/drain (S/D) electrodes 119 and 120, a gate insulation layer 113 on the crystalline material layer 102, a gate electrode 114 on the gate insulation layer 113, and spacers 115 and 116 isolating the gate electrode 114 from the low temperature contacts 111 and 112. The low temperature contacts 111 and 112 may be made, for example, of Ti, Ni, Pt, and/or Co, or any other suitable metal or metals known to those skilled in the art.

The S/D electrode 119 of the PMOS transistor 104 contacts the S/D electrode 118 of the NMOS transistor 103, thereby making the electrical contact for CMOS formation. According to one or more example embodiments, the pair of planar FETs 103, 104 (e.g., the NMOS and PMOS transistors) are formed without any shallow trench isolation (STI) there between to isolate them from each other.

In one or both of the pair of FETs 103, 104 according to one or more example embodiments, the gate electrodes 108, 114 and the corresponding gate insulation layers 107, 113, which together define a gate stack, may include one or more suitable non-crystalline materials. The non-crystalline gate material may have a gate depletion width of greater than or equal to 0 nm. In one or more example embodiments, the gate stacks of the NMOS and PMOS transistors 103, 104, respectively, may be made of different non-crystalline materials to have different work functions to control leakage and performance of the NMOS and PMOS transistors 103, 104.

According to one or more example embodiments of the present disclosure, the FETs 103, 104 are formed utilizing crystalline materials in the crystalline material layer 102. Here, the crystalline material may have a large enough bandgap and high enough mobility to enable performance of a circuit composed of a pair or multiple pairs of the planar FETs 103, 104. The large enough bandgap may generally be greater than or equal to about 1 eV, and the high enough mobility may generally be greater than or equal to about 100 $cm^2$/V-sec, and more specifically may be greater than or equal to 1 eV and greater than or equal to 100 $cm^2$/V-sec, respectively. Additionally, according to one or more example embodiments, the low temperature contacts 105, 106 and 111, 112 may be in direct contact with the S/D 117, 118 and 119, 120, respectively. For example, there may be regular salicide formation between the low temperature contacts 105, 106 and 111, 112 and the S/D 117, 118 and 119, 120.

According to one or more example embodiments, the crystalline material layer 102, and therefore the NMOS and PMOS transistors 103, 104, may be formed on an insulating material of the first ILD layer 101 (e.g., including an oxide material) without utilizing wafer bonding.

The FETs 103, 104 according to one or more example embodiments may have a longer or equal gate length and longer (e.g., two times longer) or equal contacted gate pitch than the FETs with minimum gate length and minimum contacted gate pitch formed below the upper metal routing layers of the semiconductor device. Here, the longer gate length and longer contacted gate pitch of the FETs 103, 104 may enable desired properties including, for example, lower short-channel effect and lower parasitic source-drain resistance. Further the FETs 103, 104 may be formed in a sufficiently wide region so as to have a device width that can deliver sufficiently high drive currents that are compatible with carriers having mobilities that may generally be less than FETs formed below the metal routing layers of the semiconductor device. In one or more example embodiments according to the present disclosure, the FETs 103, 104 may be connected (e.g., electrically connected) to metal lines that may generally have a metal length that is greater than or equal to 3 µm, and more specifically may have a metal length that is greater than or equal to 10 µm.

In one or more example embodiments according to the present disclosure, the FETs 103, 104, because of their proximity to metal routing layer M3, have limited via connections. According to one or more example embodiments, a repeater/buffer circuit is formed by the FETs 103, 104 together with metal and any via regions described in reference to one or more example embodiments. The repeater/buffer circuit according to one or more example embodiments may have significantly fewer vias (i.e., fewer levels of vias) than a repeater/buffer circuit formed with FETs below the upper metal routing layers of the semiconductor device. For example, the repeater/buffer circuit according to one or more example embodiments may have levels of vias that are less than or equal to 1.

In a semiconductor device according to one or more example embodiments of the present disclosure, the interconnect length of the upper metal routing layers M3 and above may be shorter than an interconnect length without such one or more example embodiments.

As can be seen in FIG. 1, the repeater 100, according to one or more example embodiments, includes a second inter-layer dielectric (ILD) layer (a second ILD layer) 121 on the FETs 103, 104. Via openings (or via holes) are formed in the second ILD layer 121 to correspond to the low temperature contacts 105 and 106 of the NMOS transistor 103, and the low temperature contact 111 and 112 of the PMOS transistor 104, so as to expose them for making electrical contacts. Through these via holes, metal vias or contacts 122, 123, 124, and 125, respectively, are formed. The vias may be formed of any suitable material, for example, tungsten, copper, etc.

As will be described in more detail in reference to the flow diagram of FIG. 3, the FETs 103, 104 according to one or more example embodiments may be processed at low temperatures, which may generally be less than or equal to 500° C., and more specifically may be at temperatures that are less than or equal to 400° C., so as to be compatible with properties of underlying metal materials and FEOL. The fabrication of the FET devices can be facilitated by processing technologies such as deposition and selective etching at temperatures lower than 500° C., such as less than 400° C.

Figure 3:
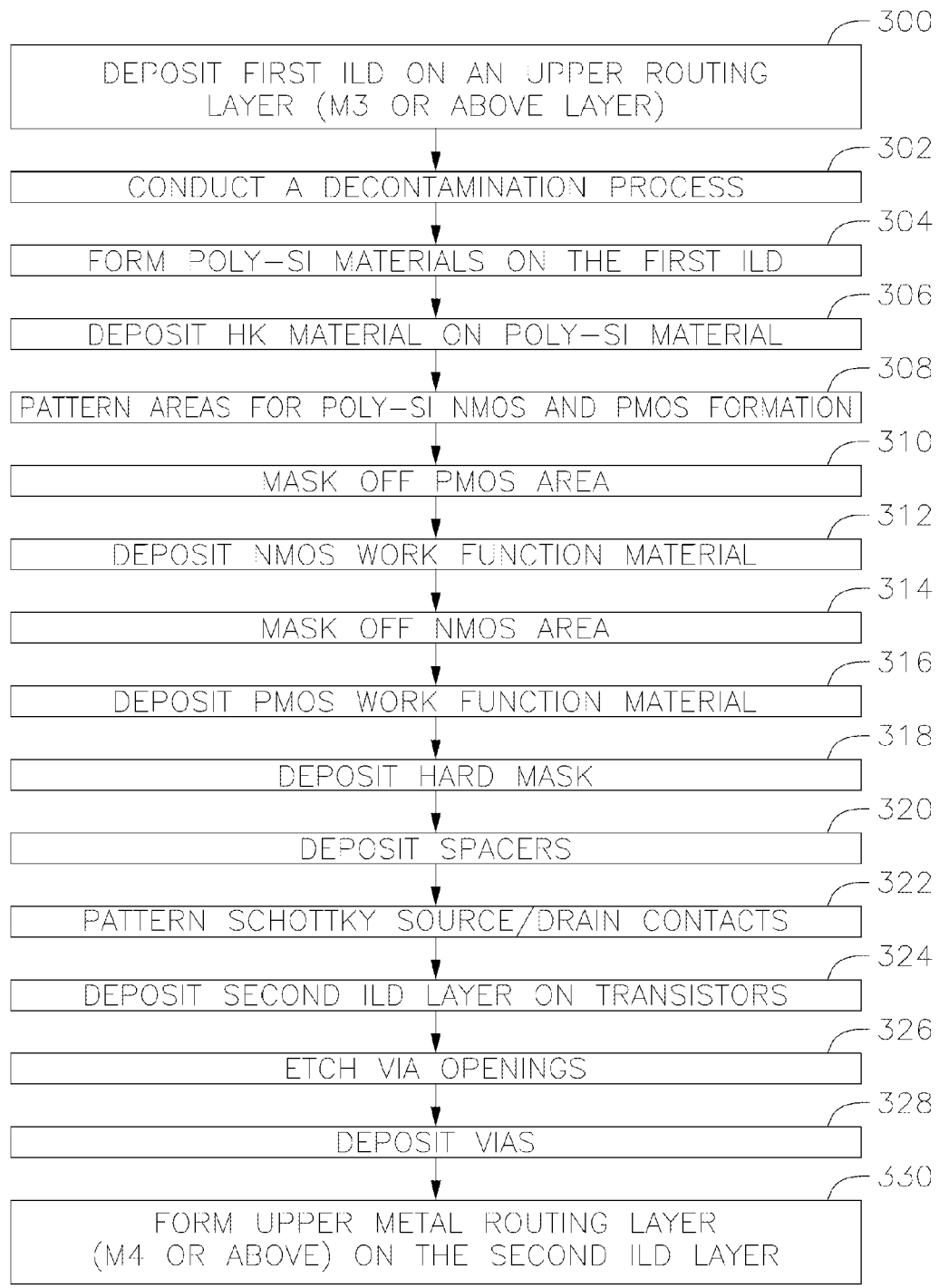
FIG. 3 is a flow diagram illustrating a process of fabricating the repeater in the semiconductor device of FIG. 1 according to one or more embodiments of the present disclosure.

FIG. 3 is a flow diagram illustrating a process of fabricating the repeater 100 in the semiconductor device of FIG. 1 according to one or more example embodiments of the present disclosure.

In block 300, a first inter-layer dielectric (ILD) layer is deposited on top of an upper metal routing layer (e.g., metal routing layer M3 or above) of a semiconductor device. The M3 or above layers may be formed on a wafer utilizing any suitable or standard process known to those skilled in the art, such as through a damascene process, and detailed description thereof are not repeated herein. The ILD layer may be deposited by any suitable manufacturing process or technique. Additionally, any standard process or processes known or hereinafter developed may be utilized to fabricate the semiconductor device up to the upper metal routing layer M3 or above on which the first ILD layer is deposited.

According to one or more embodiments of the present disclosure, the M3 or above metal routing layers, or each of the metal routing layers up to M3 or above metal routing layers is formed of Co. For example, if the repeater is formed between M3 and M4, each of M1 to M3 is formed of Co. To avoid any potential Co contamination on the repeaters to be formed later on, in block 302, a decontamination process is conducted.

Figure 4:
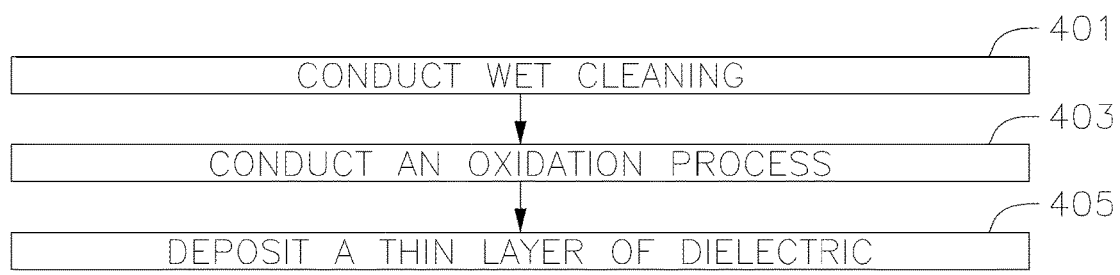
FIG. 4 is a flow diagram illustrating a process of decontamination of Co according to one or more embodiments of the present disclosure.

FIG. 4 is a flow diagram illustrating a decontamination process according to one or more example embodiments of the present disclosure. In block 401, a wet cleaning is conducted on the wafer with the metal layers and the first ILD layer formed thereon. The wet cleaning may utilize any suitable method, such as SC1/SC2, DHF, or other suitable semiconductor cleaning method for removing metal contaminations, to remove the majority of Co contamination from the front, the back and the bevel side of the wafers. SC1/SC2 is a standard wafer cleaning procedure known to those skilled in the art, and a detailed description thereof is not provided herein.

In block 403, an oxidation process is conducted on the wafer. The oxidation process may be conducted utilizing oxygen containing (such as $O_2$, $N_2O$, etc) plasma, $O_3$/UV oxidation treatment, or other oxidizing environments to convert Co atoms (e.g., all Co atoms) remaining on the wafer surface (e.g., on the surface of the first ILD layer or the back side of the wafer) into cobalt oxides at temperatures below 400° C. As such, even if some trace amount of Co atoms may still be present on the surface of the wafer (e.g., re-deposition from the clean bath applied) after the wet cleaning process, these trace amounts of Co will be converted to cobalt oxide through this oxidation process.

In block 405, a thin layer of dielectric with a thickness of 10 nm or more is deposited before the designated poly-silicon CVD channel formation process. The dielectric may be any suitable material, such as $SiO_2$ or $Si_3N_4$. Cobalt oxide has extremely low diffusivity in oxides and in silicon due to its large size and thus its diffusion through the bulk or the grain boundaries of the dielectric layer or poly-silicon to reach HK of the gate stack is reduced or prevented.

Through the decontamination process, the cobalt oxide, if there is any on the wafer, will be buried under the dielectric layer and its diffusion through poly-silicon and upward to HK may be significantly reduced or eliminated to impact device performance. Further, according to one or more embodiments of the present disclosure, there is no high temperature annealing in the subsequent process steps that may drive the movement of the buried cobalt oxides. Therefore, Co contamination on the subsequently formed repeaters is significantly reduced or minimized.

In block 304, a crystalline material is formed on the first ILD layer. The crystalline material may be formed on the first ILD layer by any suitable manufacturing process or technique, such as, for instance, low temperature chemical vapor deposition (CVD) for polycrystalline silicon.

The polycrystalline material may be formed on the first ILD layer at any suitable temperature such as, for instance, less than 500° C. (e.g., less than 400° C.). The suitable temperature at which the polycrystalline material is formed on the first ILD layer may be, for example, a temperature that the materials of the underlying interconnect system and FEOL can withstand. Additionally, subsequent device fabrication tasks may be performed at the same or similar low temperature, such as, for instance, 400° C. or less. In one embodiment, the polycrystalline silicon is formed through a CVD process at 350° C. utilizing $Si_3H_8$.

The polycrystalline material layer may serve as the channel and the source and drain electrodes of the FETs. In one embodiment, the deposited polycrystalline material layer may be further annealed to increase the grain sizes. For example, the deposited polycrystalline silicon layer may be annealed utilizing either solid phase epitaxial regrowth (SPER) at a low temperature or microwave anneal at 400° C. or less.

Here, optionally, the isolation areas for separating the FETs from each other may be masked off. Accordingly, no STI deposition to isolate the FETs from each other is needed. However, embodiments of the present disclosure are not limited thereto, and an STI may be formed to isolate the FETs from each other.

In block 306, an HK material is deposited on the crystalline material that was formed in block 304 to form N and P transistor regions. In one or more embodiments, the deposition of the HK material may be performed at a low temperature, such as, for example, at a temperature of less than or equal to 400° C. In one embodiment, the dielectric material, e.g., high quality silicon oxide, e.g., $SiO_2$, is formed by irradiating silicon with a neutral oxygen beam at low temperatures, for example, 200° C. to 400° C. The depositing of the HK dielectric layer at temperatures lower than 400° C. may include forming silicon oxides utilizing a low temperature oxidation assisted by neutral oxygen beam. Comparable thermal gate oxide $SiO_2$ formation process is done at 1000° C. or higher, which is not compatible to materials forming BEOL.

In block 308, the method includes patterning areas for N and P transistor regions. In block 310, a PMOS area of the polycrystalline material layer is masked off. The mask may be formed on the polycrystalline material layer by any suitable manufacturing technique or process.

In block 312, a low temperature NMOS work function material is deposited on an exposed portion of the crystalline material layer that was not covered by the mask formed in block 310. In one or more embodiments, the Poly-Semiconductor NMOS work function material may be deposited in a gate-first process.

In block 314, an NMOS area of the polycrystalline material layer is masked off. The mask may be formed on the polycrystalline material layer by any suitable manufacturing technique or process.

In block 316, a low temperature PMOS work function material is deposited on an exposed portion of the crystalline material layer that was not covered by the mask formed in block 314. Optionally, selective epitaxial (EPI) regrowth of S/D utilizing higher order precursors may be conducted at a low temperature, for example, a temperature less than 400° C. after the deposition of the PMOS work function material. Suitable precursors for the EPI regrowth process may include $Si_2H_6$, $Si_3H_8$, $Si_4H_{10}$, $Ge_2H_6$, $Ge_4H_{10}$, etc. In one embodiment, the EPI regrowth process may be mixed with certain etching gases, such as HCl, to ensure adequate selectivity during the EPI growth.

In block 318, a patterned hard mask (e.g., a carbon hard mask) is deposited for use in a subsequent etching process.

In block 320, low temperature spacers are deposited.

Optionally, ion implantation (I/I) may be conducted after the deposition of the low temperature spacers for high S/D dopant activation utilizing a low temperature process, such as low temperature solid phase epitaxial regrowth (SPER) at 600° C. or less, or low temperature microwave annealing (MWA) at 300° C. to 400° C. In one embodiment, the high S/D dopant activation is not conducted.

In block 322, low temperature metallic Schottky source/drain (S/D) contacts are patterned, for example, at or below 450° C. In one or more embodiments, no dopant activation or epitaxy may be utilized.

In block 324, a second inter-layer dielectric (ILD) layer is deposited on the transistor layer (e.g., on the NMOS and PMOS transistors). The second ILD layer may be deposited on the NMOS and PMOS transistors by any suitable manufacturing process or technique.

In block 326, one or more via openings (or via holes) are etched through the second ILD layer on the transistor layer. The one or more via openings may be formed by any suitable etching technique, such as, for instance, by a dry etching process (e.g., plasma etching).

In block 328, one or more vias for power and signal connection are deposited (e.g., formed by metal deposition) in the one or more via openings in the second ILD layer such that the one or more vias (metal formed inside the via openings) extend from PMOS and NMOS transistors through the second ILD layer.

In block 330, an upper metal routing layer (e.g., metal layer M4 or above) is formed on the second ILD layer. The upper metal routing layer (M4 or above) may be formed of any suitable material, such as copper, and the upper metal routing layer may be formed by any suitable manufacturing process or technique, such as additive patterning (e.g., a damascene process). In one embodiment, the metal routing layers under the repeater are formed of a first metal, such as Co, and the metal routing layers above the repeater are formed of a second metal, such as Cu. That is, the metal routing layers under the repeater are formed of a different metal from the metal routing layers above the repeater.

According to one or more embodiment of the present disclosure, a repeater inserted in upper metal routing layers is manufactured utilizing a low temperature process compatible with the properties of the underlying materials, where the temperature for the entire repeater forming process is at 500° C. or less, for example, at 400° C. or less.

Figure 5A:
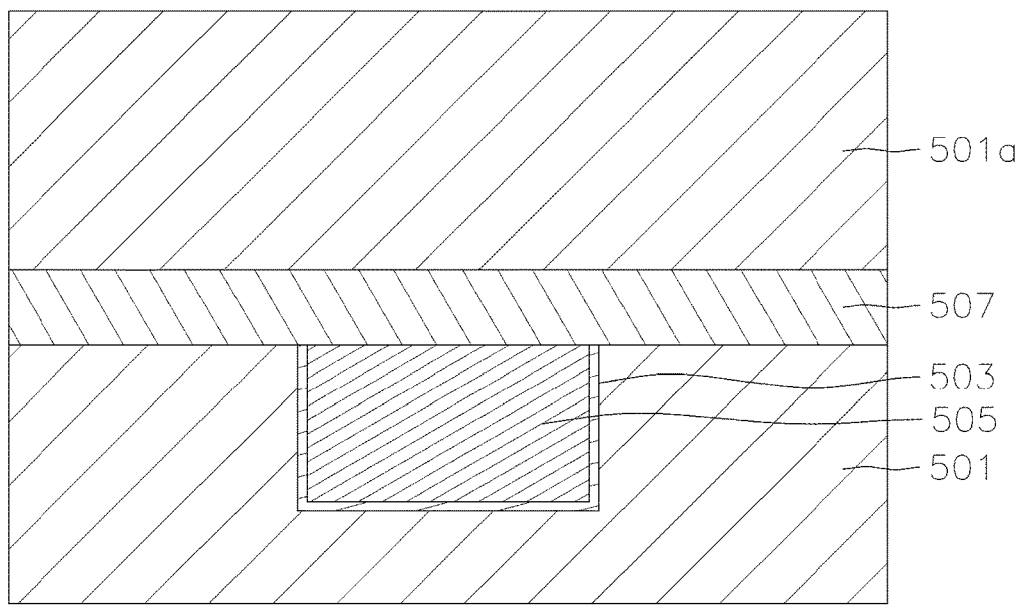
FIGS. 5(a) to 5(h) are schematic illustrations of a process of fabricating a repeater in a semiconductor device according to one or more embodiments of the present disclosure.

FIGS. 5A to 5H are schematic illustrations of a process of fabricating a repeater in a semiconductor device according to one or more example embodiments of the present disclosure. Referring to FIG. 5A, a wafer including a metal routing layer 505 (e.g., M3) formed of Co has a layer of nitride 507 (e.g., TiN or TaN) formed on metal routing layer 505. Co may be formed and surrounded in an ILD layer 501 except for the top side. Co may be formed utilizing any suitable process, such as Damascene process. A barrier (liner) 503 may be between the ILD layer 501 and the metal routing layer 505. The barrier 503 may be formed of a suitable barrier material, such as TiN or TaN.

Figure 5B:
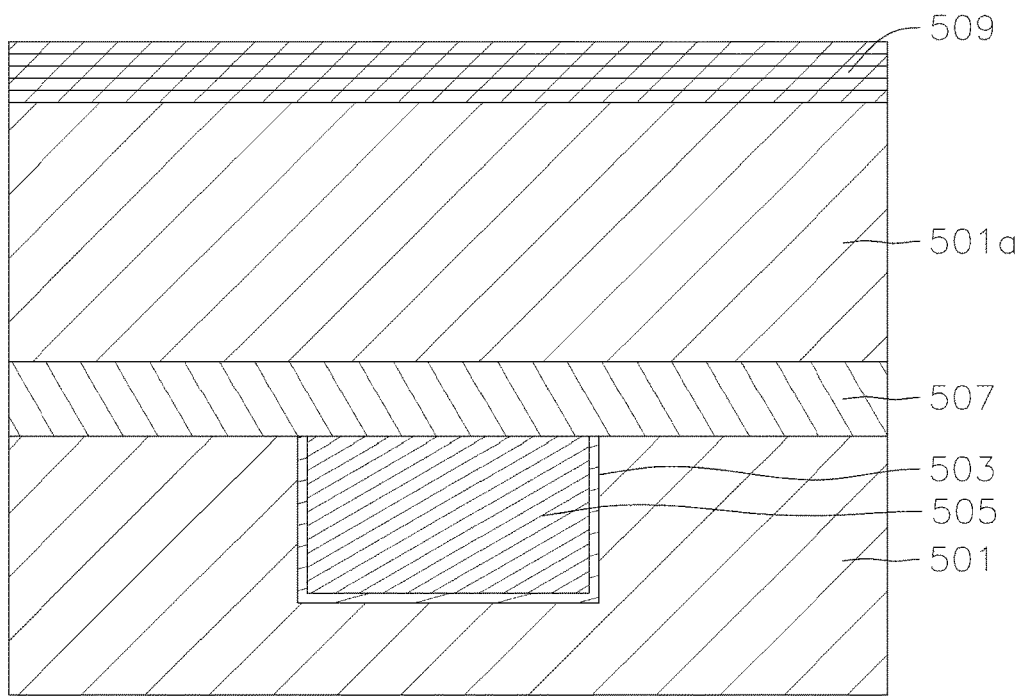

Referring to FIG. 5B, a first inter-layer dielectric (ILD) layer 501a is deposited on top of the metal routing layer 505 and a polysilicon layer 509 is formed on the first ILD layer 501a. The polysilicon layer 509 may be formed on the first ILD layer 501a at any suitable temperature such as, for instance, less than 500° C. (e.g., less than 400° C.).

Figure 5C:
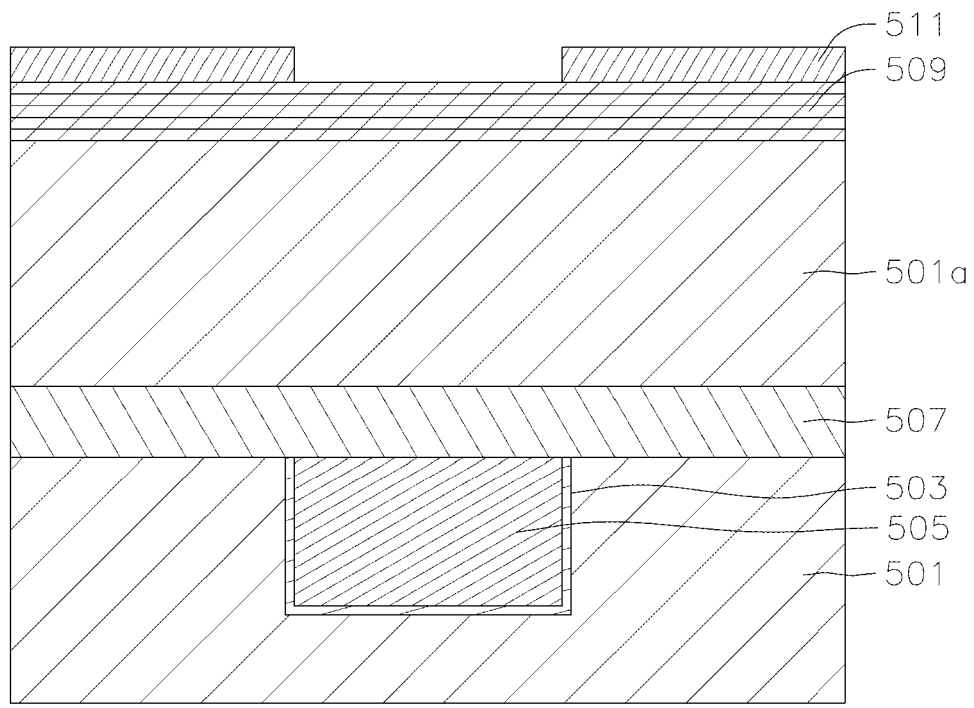

Referring to FIG. 5C, an HK material is deposited on the crystalline material in areas corresponding to the N and P transistor regions to form an HK layer 511.

Figure 5D:
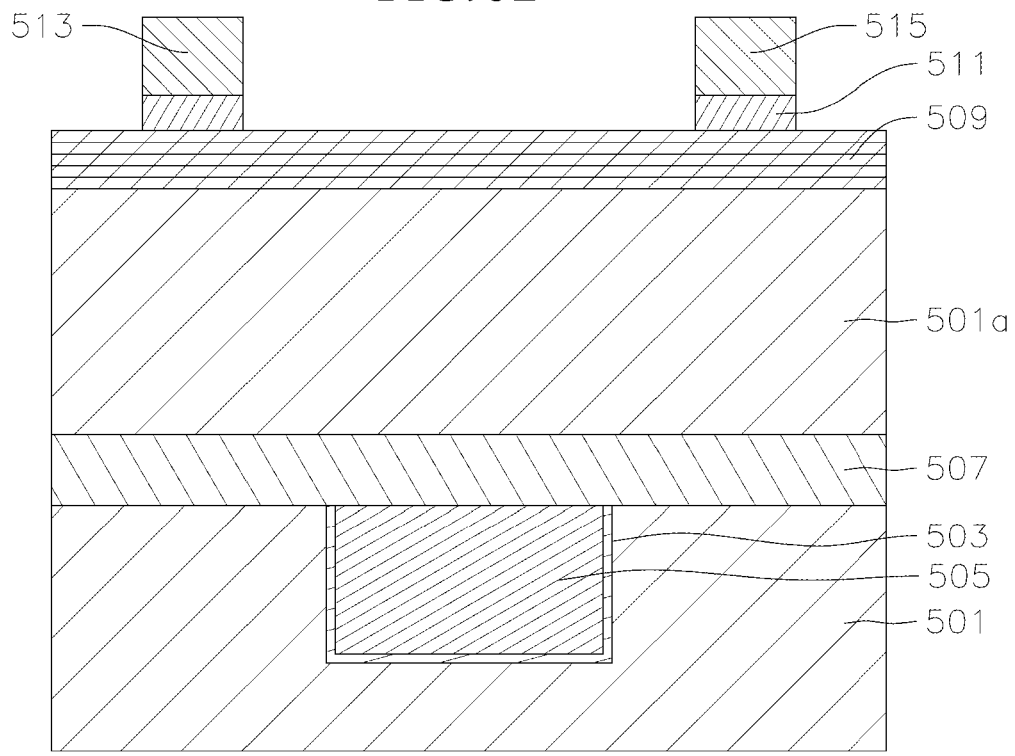

Referring to FIG. 5D, an NMOS work function material 513 and a PMOS work function material 515 are deposited on the HK layer 511 of the respective N and P transistor regions to form the gate electrodes. The NMOS work function material 513 and the PMOS work function material 515 may be formed on the HK layer 511 at any suitable temperature such as, for instance, less than 500° C. (e.g., less than 400° C.).

Figure 5E:
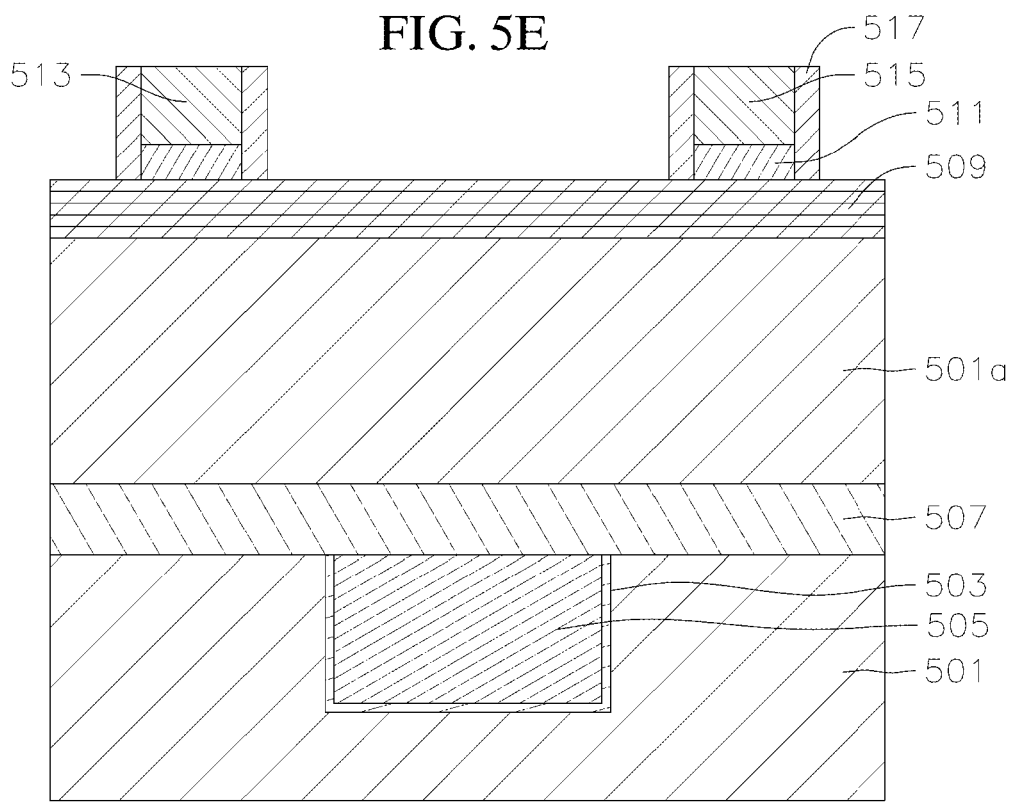
Figure 5F:
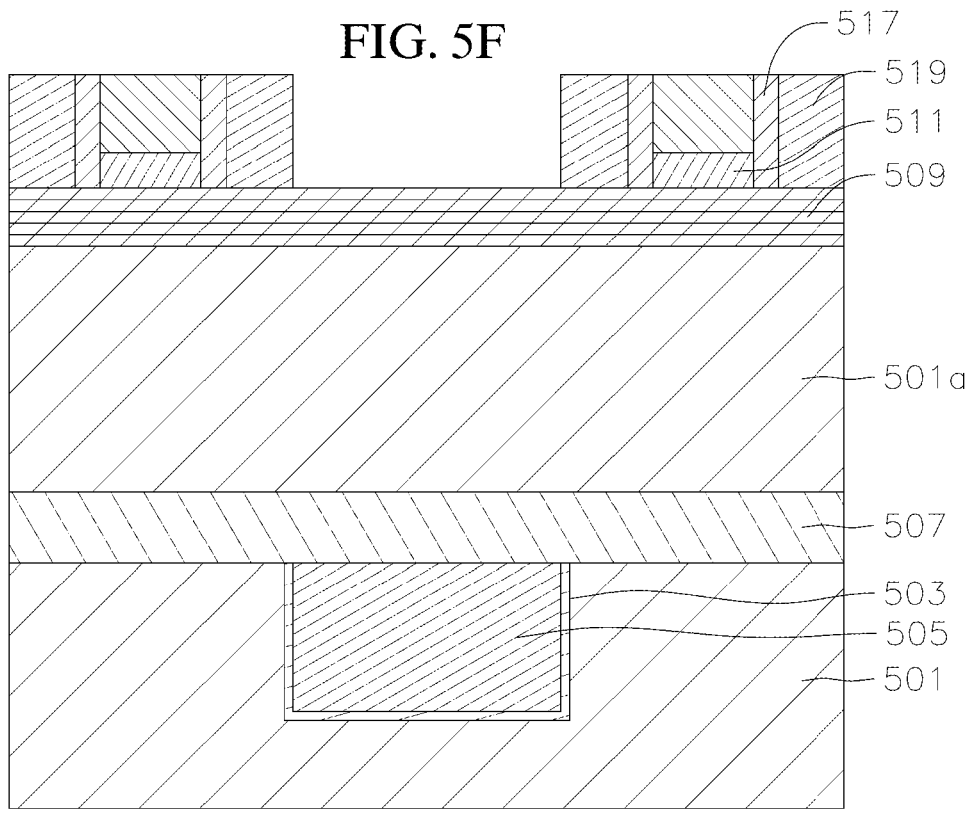

Referring to FIG. 5E, spacers 517 are formed around the gate electrodes. The spacers 517 may be formed at any suitable temperature such as, for instance, less than 500° C. (e.g., less than 400° C.). Referring to FIG. 5F, contacts 519 are formed in areas corresponding to source and drain regions of the N and P transistors, for example, at or below 400° C. The contacts 519 may be formed of a suitable material, such as Ti.

Figure 5G:
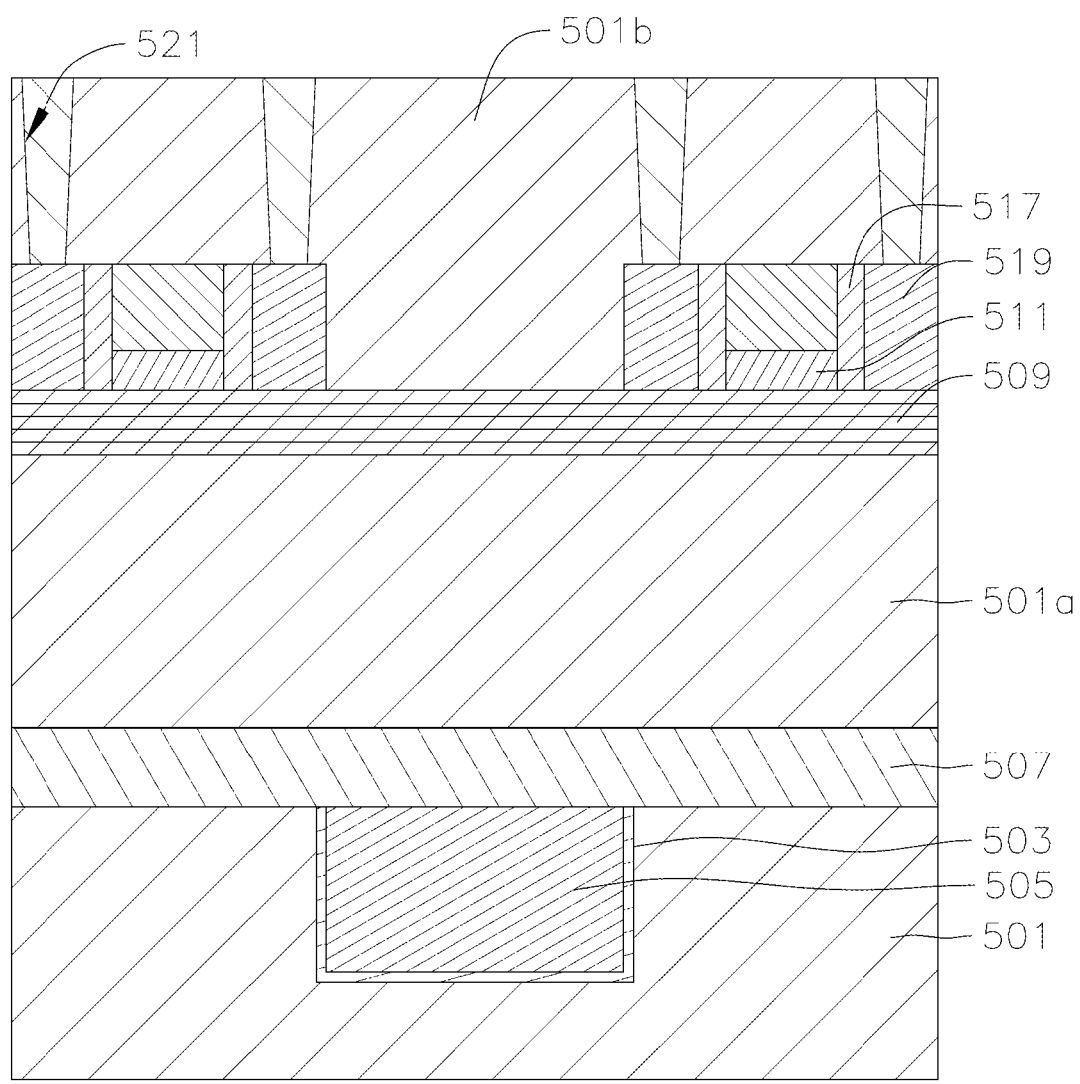

Referring to FIG. 5G, a second inter-layer dielectric (ILD) layer 501b is deposited on the transistor layer (e.g., on the NMOS and PMOS transistors). Via openings (or via holes) 521 are etched through the second ILD layer 501b on the transistor layer to correspond to the contacts 519 underneath.

Figure 5H:
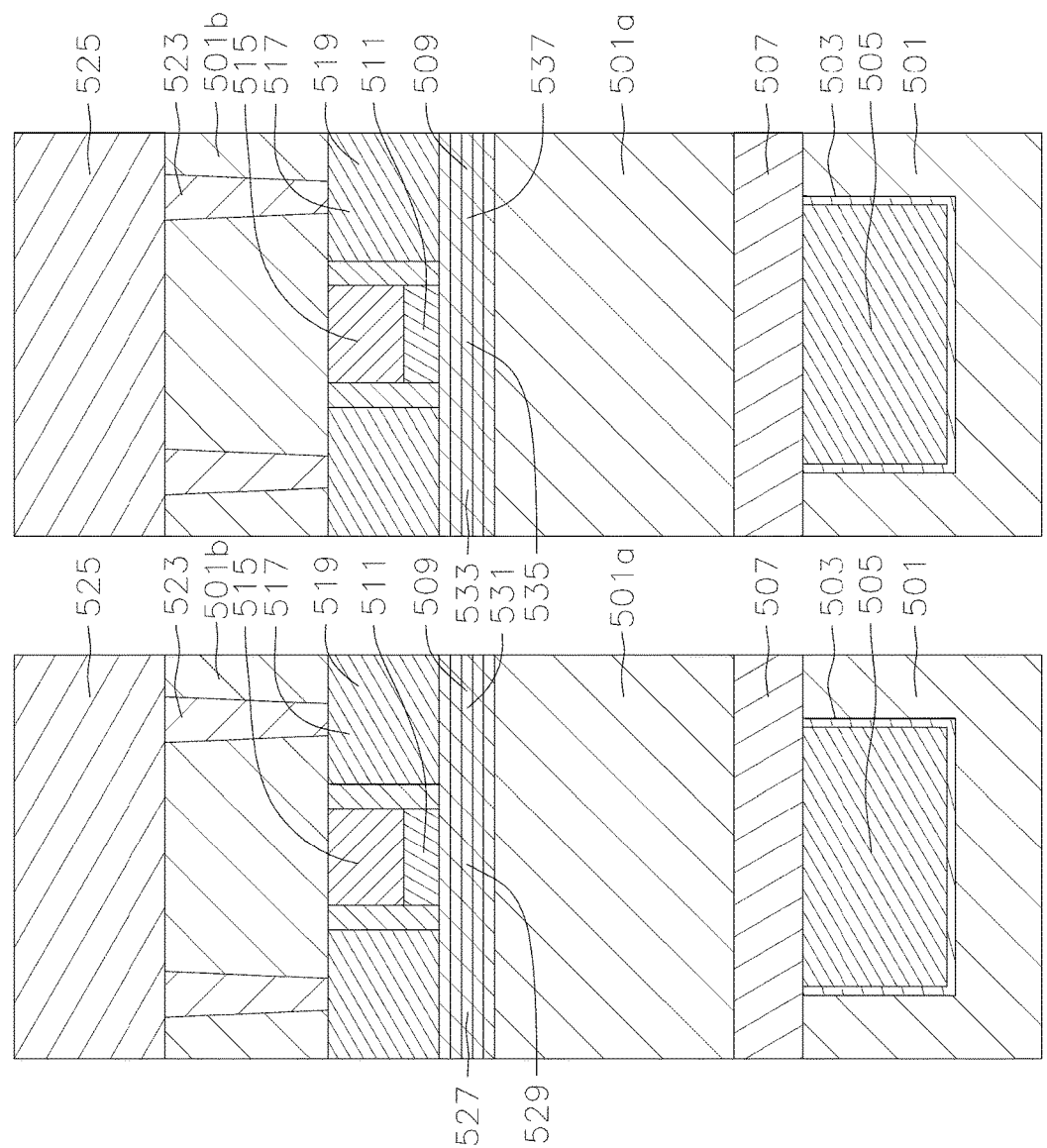

Referring to FIG. 5H, vias 523 for power and signal connection are deposited (e.g., formed by metal deposition) in the via openings 521 in the second ILD layer 501b such that the vias 523 extend from PMOS and NMOS transistors through the second ILD layer 501b. Further, an upper metal routing layer 525 (e.g., M4) formed of Cu is formed on the second ILD layer 501b.

Figure 6:
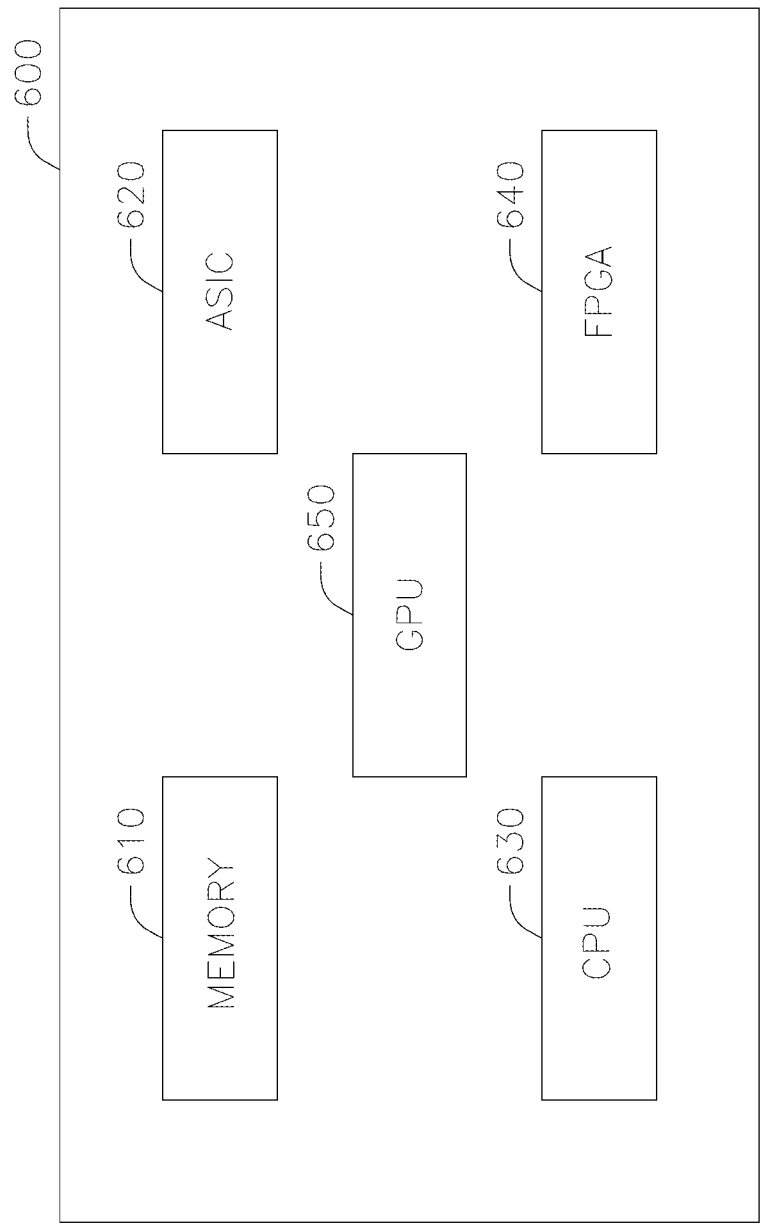
FIG. 6 is a schematic view of an electronic device including a repeater according to one or more embodiments of the present disclosure.

Referring now to FIG. 6, an electronic device 600 may include at least one of a memory 610, an application specific integrated circuit (ASIC) 620, a central processing unit (CPU) 630, a field programmable gate array (FPGA) 640, and a graphics processing unit (GPU) 650. The repeater/buffer circuit 100 may be included in any one of the memory 610, the ASIC 620, the CPU 630, the FPGA 640, and the GPU 650.

The electronic device 600 may be a stand-alone system that uses the repeater/buffer circuit 100 to perform one or more electrical functions. Alternatively, the electronic device 600 may be a subcomponent of a larger system. For example, the electronic device 600 may be part of a computer, a cellular phone, a personal digital assistant (PDA), a digital video camera (DVC), or other electronic communication device. Alternatively, the electronic device 600 may be the memory 610, the ASIC 620, the CPU 630, the FPGA 640, the GPU 650, a network interface card, or other signal processing card that can be inserted or included in a computer or other larger system.

According to one or more embodiments of the present disclosure, a CMOS repeater including a crystalline material layer has adequately high device performance, is BEOL compatible and is devoid of Cu contamination concerns. Further, a semiconductor device manufactured according to one or more embodiments of the present disclosure has reduced interconnect resistance due to reduction of vias from the metal layers to the repeaters and reduced interconnect resistance and capacitance due to reduction of lower level interconnect metal layers. Further, due to the reduced resistance, more frequent usage of repeaters is enabled, which leads to the reduction in interconnect length between repeater stages, and hence opens up area to insert other functionalities on-chip. The reduced interconnect length further leads to reduction of BEOL capacitance and increased routing resources. Cu contamination is reduced or avoided by utilizing Co with equivalent resistance performance. Further, cobalt cross-contamination is addressed with a highly manufacturable 3-step decontamination process. Low temperature polycrystalline silicon CMOS is enabled according to one or more embodiments of the present disclosure.

According to one or more embodiment of the present disclosure, a fully depleted transistor is formed utilizing a polycrystalline silicon deposited on insulator at a low temperature (i.e. at any temperature compatible with underlying layers, e.g. at 500° C. or less) on the upper metal routing layers (e.g., at M3) with Co utilized as the metal for the lower metal routing layers. The transistor is combined with other like transistors to comprise a circuit, in one embodiment, the circuit being a repeater/buffer, with the via connections eliminated or substantially eliminated from the circuit (for example, from the repeater/buffer circuit).

Although the present disclosure has been described with reference to the example embodiments, those skilled in the art will recognize that various changes and modifications to the described embodiments may be performed, all without departing from the spirit and scope of the present disclosure. For example, while crystalline material transistors manufactured on a routing metal layer such as M3 has been described, embodiments of the present description are not limited thereto. In one embodiment, the crystalline material transistors may be manufactured at the same level as the metal routing layer, e.g., the crystalline material transistors may be located on the same layer as the metal routing layer without forming an additional layer over the metal routing layer. In addition, while Co has been described for forming the metal routing layer on which the repeaters are formed and the metal routing layers below it, other suitable metals may be utilized in place of Co, such as tungsten or ruthenium where applicable. Further, while metal routing layer M3 or M4 formed over the second ILD has been described, additional upper metal layers may be further formed over M3 or M4, such as M5, M6, etc. in subsequent processes.

Furthermore, those skilled in the various arts will recognize that the present disclosure described herein will suggest solutions to other tasks and adaptations for other applications. It is the applicant's intention to cover by the claims herein, all such uses of the present disclosure, and those changes and modifications which could be made to the example embodiments of the present disclosure herein chosen for the purpose of disclosure, all without departing from the spirit and scope of the present disclosure. Thus, the example embodiments of the present disclosure should be considered in all respects as illustrative and not restrictive, with the spirit and scope of the present disclosure being indicated by the appended claims, and their equivalents.

What is claimed is:

1. A semiconductor device comprising:
   metal routing layers M1 to Ma, a being an integer selected from 4 or greater, the metal routing layers stacking up from M1 in a thickness direction;
   a complementary pair of planar field-effect transistors (FETs) on metal routing layer Mb, b being smaller than a and selected from 3 or greater;
   a first inter-layer dielectric layer comprising a first inter-layer dielectric material and between the metal routing layer Mb and the complementary pair of FETs,
   a crystalline material layer comprising a polycrystalline material and formed on the first inter-layer dielectric material,
   a second inter-layer dielectric layer comprising a second inter-layer dielectric material and between the complementary pair of FETs and metal routing layer M(b+1), and
   metal vias through the second inter-layer dielectric layer, wherein each of the FETs comprises a channel region formed of the polycrystalline material,
   wherein the complementary pair of FETs are between the metal routing layer Mb and metal routing layer M(b+1),
   wherein the channel region formed of the polycrystalline material is directly on the first inter-layer dielectric layer, and the polycrystalline material comprises polycrystalline silicon,
   wherein the FETs are arranged in a repeater/buffer circuit consisting of one level of via or no vias,
   wherein each of the FETs further comgrises source and drain electrodes comprising the polycrystalline material, a gate insulation layer on the crystalline material layer, a gate electrode on the gate insulation layer, low temperature contacts in direct contact with the source and drain electrodes and comprising Ti, Ni, Pt, and/or Co, and a gate spacer between the gate electrode and the low temperature contacts, the gate spacer comprising a nitride and in direct contact with the low temperature contacts, and
   the metal vias connect the low temperature contacts with the metal routing layer M(b+1).

2. The semiconductor device of claim 1, wherein b is 3, and M3 comprises cobalt (Co) or ruthenium (Ru).

3. The semiconductor device of claim 2, wherein M1, M2 and M3 each independently comprises cobalt (Co) or ruthenium (Ru).

4. The semiconductor device of claim 1, further comprising an insulating material on metal routing layer Mb, and the complementary pair of planar FETs being on the insulating material.

5. The semiconductor device of claim 1, wherein the polycrystalline material has a bandgap of about 1 eV or greater and a mobility of about 100 $cm^2$/N-sec or greater.

6. The semiconductor device of claim 1, wherein the semiconductor device does not include a shallow trench isolation (STI) between the pair of planar FETs to isolate them from each other.

7. The semiconductor device of claim 1, wherein the complementary pair of planar FETs are in an inverter configuration.

8. The semiconductor device of claim 1, wherein each FET comprises a gate stack comprising non-crystalline materials.

9. The semiconductor device of claim 1, wherein a thickness of the polycrystalline material is about 5 nm to about 15 nm.

10. A semiconductor device comprising: metal routing layers M1 to Ma, a being an integer selected from 4 or greater, the metal routing layers stacking up from M1 in a thickness direction;
   a complementary pair of planar field-effect transistors (FETs) on metal routing layer Mb, b being smaller than a and selected from 3 or greater,
   a first inter-layer dielectric layer comprising a first inter-layer dielectric material and between the metal routing layer Mb and the complementary pair of planar FETs,
   a crystalline material layer comprising a polycrystalline material and formed on the first inter-layer dielectric material, a second inter-layer dielectric layer comprising a second inter-layer dielectric material and between the complementary pair of FETs and metal routing layer M (b+1), and metal vias through the second inter-layer dielectric layer, wherein each of the FETs comprises a channel region formed of the polycrystalline material, and wherein the complementary pair of planar FETs are between the metal routing layer Mb and metal routing layer M(b+1)

wherein each FET of the pair of planar FETs further comprises source and drain regions comprising the polycrystalline material of the channel region, wherein each FET further comprises a pair of metal regions comprising Ti, Ni, Pt, and/or Co, and directly contacting the source and drain regions with regular salicide formation between the pair of metal regions and the source and drain regions, wherein each FET further comprises a gate insulation layer on the crystalline material layer, a gate electrode on the gate insulation layer, and a gate spacer between the gate electrode and the pair of metal regions, the gate spacer comprising a nitride and in direct contact with the pair of metal regions, wherein the FETs are arranged in a repeater/buffer circuit consisting of one level of via or no vias, and wherein the metal vias connect the pair of metal regions with the metal routing layer M(b+1).

* * * * *